United States Patent [19]

Takahashi

[11] Patent Number: 5,646,443
[45] Date of Patent: Jul. 8, 1997

[54] SEMICONDUCTOR PACKAGE

[75] Inventor: Takehiko Takahashi, Tokyo, Japan

[73] Assignee: NEC Corporation, Tokyo, Japan

[21] Appl. No.: 584,161

[22] Filed: Jan. 11, 1996

Related U.S. Application Data

[63] Continuation of Ser. No. 323,313, Oct. 14, 1994, abandoned.

[30] Foreign Application Priority Data

Oct. 15, 1993 [JP] Japan ..................... 5-281637

[51] Int. Cl.$^6$ .................................... H01L 23/12
[52] U.S. Cl. ............ 257/704; 257/730; 257/678;
361/820; 53/331.5; 53/486; 53/487; 53/488
[58] Field of Search ..................... 257/704, 710,
257/730, 797, 718, 81, 99, 433, 434, 678,
682; 361/802, 741, 820, 756; 217/56; 53/331.5,
486, 487, 488

[56] References Cited

U.S. PATENT DOCUMENTS 1,345,856  7/1920  Hughes ..................... 217/56
4,630,095  12/1986  Otsuka et al. ..................... 257/660

FOREIGN PATENT DOCUMENTS

| 62-106653 | 5/1987 | Japan | 257/704 |
| 62-97355 | 5/1987 | Japan | 257/704 |
| 63-275152 | 11/1988 | Japan | 257/704 |
| 1-187839 | 7/1989 | Japan | 257/704 |
| 27453 | 1/1990 | Japan . | |
| 3-35547 | 2/1991 | Japan | 257/704 |
| 4-43671 | 2/1992 | Japan | 257/704 |
| 4-177862 | 6/1992 | Japan | 257/704 |
| 4-246847 | 9/1992 | Japan | 257/704 |

*Primary Examiner*—Jerome Jackson
*Assistant Examiner*—John Guay
*Attorney, Agent, or Firm*—Sughrue, Mion, Zinn, Macpeak & Seas

[57] ABSTRACT

A semiconductor package has a guide in the form of a lug only at least two diagonally opposite corners on the upper surface thereof. A cap to be adhered to the package is configured to mate with the inside surfaces of the guides. The package is, therefore, surely seated and held in close adhesion to the cap.

1 Claim, 3 Drawing Sheets

5,646,443

1

SEMICONDUCTOR PACKAGE

This is a continuation of application Ser. No. 08/323,313 filed Oct. 14, 1994, now abandoned.

BACKGROUND OF THE INVENTION

The present invention relates to a semiconductor package for receiving a CCD (Charge Coupled Device), ROM (Read Only Memory) or similar semiconductor device and sealing it therein with a cap adhered thereto. More particularly, the present invention relates to a semiconductor package with improved air-tightness and close adhesion to a cap.

A semiconductor package of the kind described is disclosed in, for example, Japanese Patent Laid-Open Publication No. 2-7453. The conventional package has an upper surface to which a cap is to be adhered. A plurality or grooves are formed in the upper surface of the package. When the cap is adhered to and pressed against the package, air inside the package is forced out and replaced with nitrogen via the grooves. Such a configuration, however, lacks an implementation for guiding the cap on the upper surface of the package and, therefore, obstructs the accurate positioning of the former on the latter.

In light of the above, there has been proposed a semiconductor package having a stepped recess in the upper surface thereof. The stepped recess forms side walls which play the role of guide means when a cap is received in the recess, so that the cap may be accurately positioned on the package. This kind of scheme, however, brings about another drawback that the side walls, or guide means, prevent air inside the package from being fully discharged in the event of adhesion of the cap to the package. As a result, not only the sealability of the package but also the close adhesion thereof to the cap are degraded.

SUMMARY OF THE INVENTION

It is, therefore, an object of the present invention to provide a semiconductor package which surely remains air-tight when sealed by a cap and adheres closely to the cap.

A semiconductor package of the present invention comprises a cap for hermetically sealing the package, an adhering surface to which the cap is to be adhered, and a guide in the form of a lug positioned at a plurality of corners of the adhering surface.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1A:
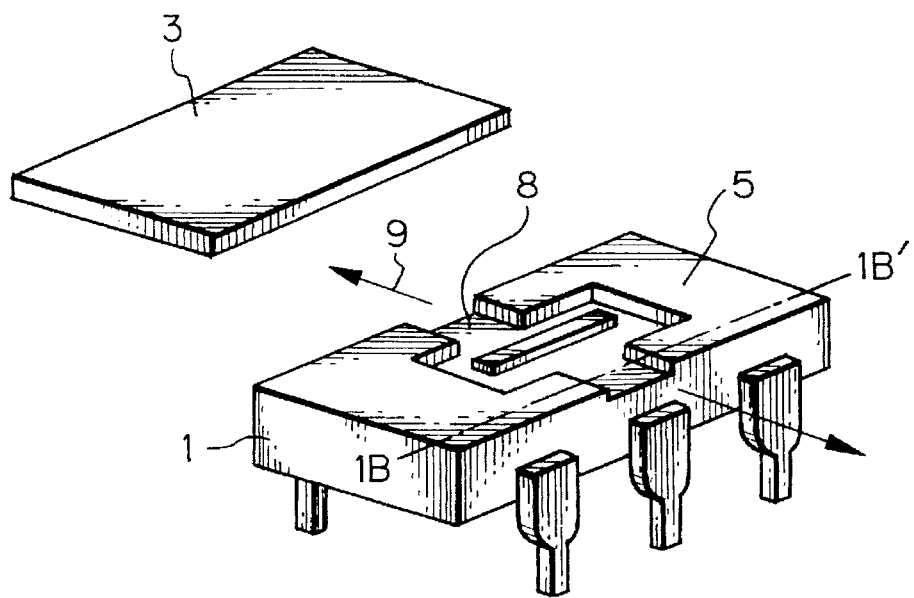
FIG. 1A is a perspective view of a conventional semiconductor package.
Figure 1B:
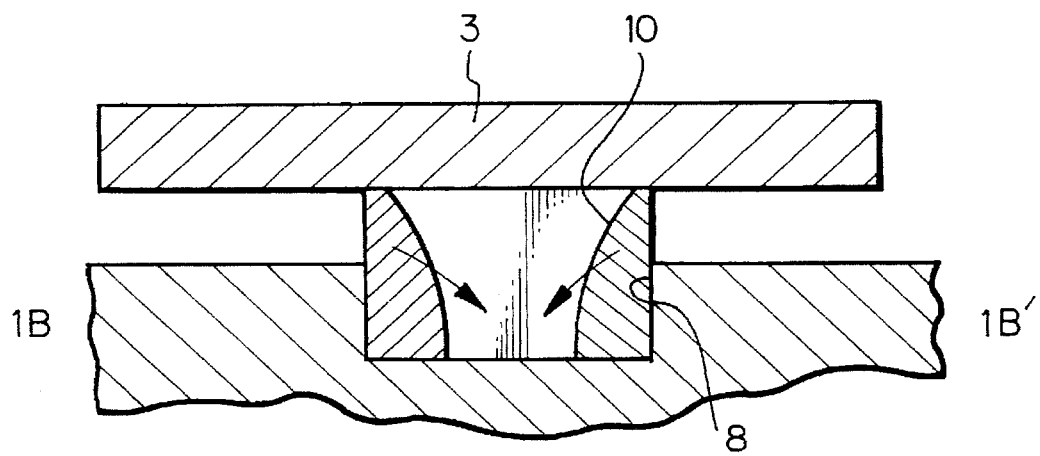
FIG. 1B is a fragmentary enlarged section along line 1B-1B' of FIG. 1A.

To better understand the present invention, a brief reference will be made to a conventional semiconductor package,

2 shown in FIGS. 1A and 1B. The package to be described has a structure taught in the previously mentioned Japanese Patent Laid-Open Publication No. 2-7453. As shown in FIG. 1A, the package, generally 1, has a surface 5 to which a cap 3 is to be adhered. The surface 5 is formed with a plurality of grooves 8, as illustrated. After the cap 3 has been adhered to the surface 5, the package 1 is cured in a nitrogen atmosphere with the top of the cap 3 pressed by a jig or similar implement, not shown- As a result, air 9 inside the package is forced out via the grooves 8 and replaced with nitrogen. Subsequently, the grooves 8 are stopped by sealing resin 10, FIG. 1B. In such a structure, air 9 inside the package can be easily replaced with nitrogen atmosphere.

However, the problem with the package 1 having the above structure is that it lacks an implementation for guiding the cap 3 on the surface 5. It is, therefore, likely that the cap 3 is displaced in the horizontal direction when adhered to the surface 5. As a result, a substantial period of time is necessary for the cap 3 to be accurately positioned on the surface 5, obstructing efficient assembly.

Figure 2A:
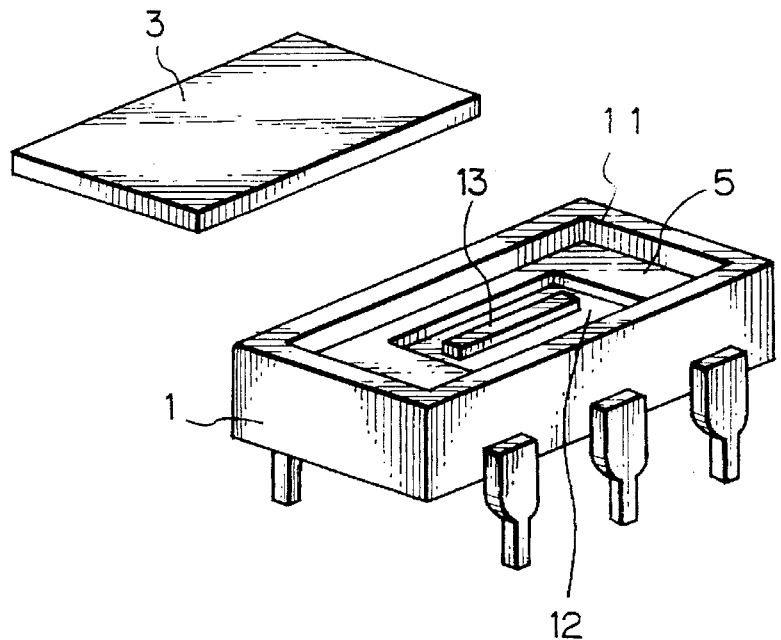
FIG. 2A is a perspective view of another conventional semiconductor package.
Figure 2B:
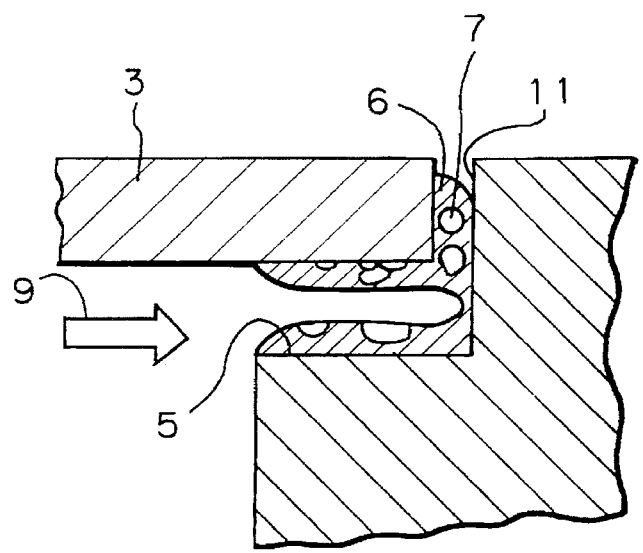
FIG. 2B is a fragmentary enlarged section of package shown in FIG. 2A.

Another conventional semiconductor package is shown in FIGS. 2A and 2B. As shown in FIG. 2A, the package 1 has the central part thereof recessed in two steps to form a first surface, or adhering surface, 5 and a second surface 12. The second surface 12 is used to support a semiconductor pellet 13 thereon. Side walls 11, extending from the first surface 5 to the top of the package 1, constitute a guide or frame. This kind of configuration allows the cap 3 to be accurately positioned on the adhering surface 5 in the horizontal direction due to the guide 11. Even this package 1 has a problem yet to be solved, as follows. As shown in FIG. 2B specifically, the adhering surface 5 is delimited by the side walls 11. When the cap 3 is adhered to the surface 5, air 9 inside the package 1 is confined by the cap 3 and adhesive 6 surrounding the cap 3. This, coupled with the fact that the cap 3 is pressed downward, increases the pressure inside the package 1 and tends to force air 9 out of the package 1 via the adhesive 6. However, the side walls 11 prevent air 9 from flowing out easily and causes it to remain in the adhesive 6 in the form of bubbles 7, thereby obstructing the close adhesion of the cap 3 to the surface 5. Moreover, the bubbles 7 in the adhesive 6 allow outside air into the package 1, degrading the sealability of the package 1.

Figure 3A:
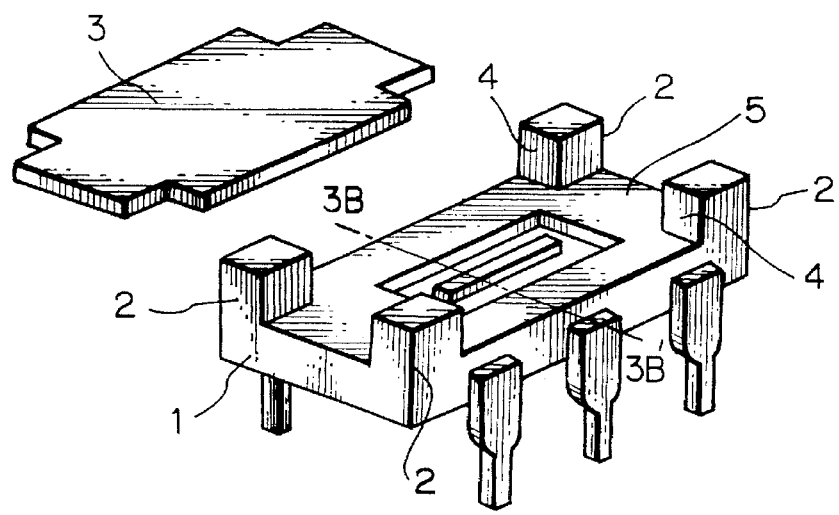
FIG. 3A is a perspective view of a semiconductor package embodying the present invention.
Figure 3B:
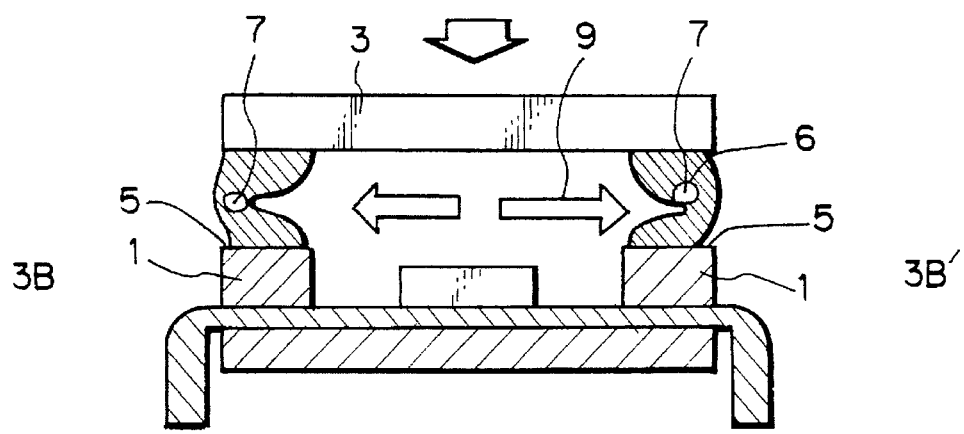
FIG. 3B is a section along line 3B-3B' of FIG. 3A.

Referring to FIGS. 3A and 3B, a semiconductor package embodying the present invention is shown. In the figures, the same or similar constituent parts as the parts of the conventional packages are designated by the same reference numerals. As shown in FIG. 3A, the package, generally 1, has a guide in the form of a rectangular lug 2 at each of four corners on the upper surface thereof. A cap 3 is notched at four corners thereof so as to mate with inner surfaces, or guide surfaces, 4 included the guides 2. Since the configuration of the cap 3 complementary to the configuration of the guide surfaces 4, the cap 3 can be easily adhered to the package 1 without any displacement in the horizontal direction. It is noteworthy that the guides on the package 1, i.e., the guide surfaces 4 thereof are spaced apart from each other.

As shown in FIG. 3B, the cap 3 is adhered to the surface 5 of the package 1 by adhesive 6 and pressed from above the package 1. In this condition, air 9 in the package 1 and bubbles 7 in the adhesive 6 flow out easily via the adhesive 6 since nothing, except for the four guides 2 obstructs them.

Figure 4:
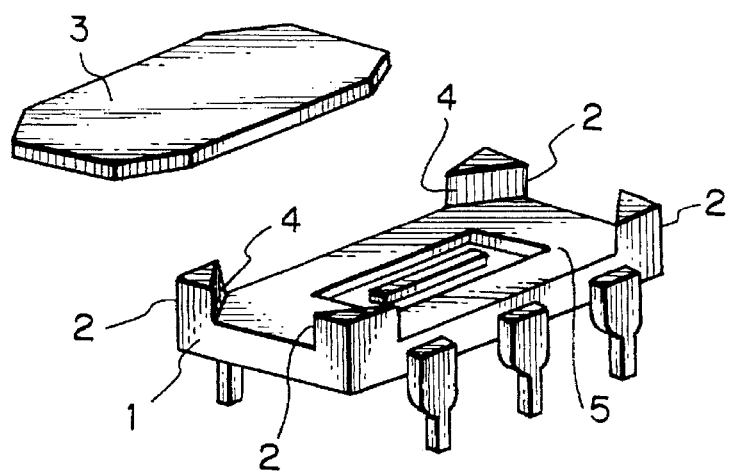
FIG. 4 is a perspective view showing an alternative embodiment of the present invention.

FIG. 4 shows an alternative embodiment of the present invention. As shown, the guides 2 of the package 1 each has a triangular section, as seen in a plan view, which is equivalent to one half of the guide 2 of the previous embodiment cut along a diagonal The cap 3 is chamfered at four corners thereof to have a configuration complementary to the guides 2, i.e., flat guide surfaces 4. Since the cap 3 should only be chamfered, it is easier to machine and lower in cost than the cap 3 of the previous embodiments.

In summary, it will be seen that the present invention provides a semiconductor package which eliminates time losses attributable to the correction of the position of a cap in the horizontal direction, thereby enhancing efficient assembly. In addition, the package of the invention surely forces air out of adhesive and reduces defective products resulting from defective sealing. These unprecedented advantages are derived from lugs, or guides, provided only at four corners on the upper surface of the package.

Various modifications will become possible for those skilled in the art after receiving the teachings of the present disclosure without departing from the scope thereof. For example, the guide or lug 2 may be formed only at two diagonally opposite corners on the package 1, if desired.

What is claimed is:

1. A semiconductor package comprising:

a cap for hermetically sealing said package;

a bottom portion comprising an adhering surface to which said cap may be adhered and a plurality of guides each having the form of a lug, wherein one guide is positioned at each corner of said adhering surface, said cap having a plurality of corner regions shaped in a complementary fashion to said plurality of guides, wherein said cap is positioned over said adhering surface such that said cap lies entirely between said guides, wherein said guides have a triangular shape.

* * * * *